(12) United States Patent
Chong et al.

(10) Patent No.: US 7,645,687 B2
(45) Date of Patent: Jan. 12, 2010

(54) METHOD TO FABRICATE VARIABLE WORK FUNCTION GATES FOR FUSI DEVICES

(75) Inventors: Yung Fu Chong, Singapore (SG); Dong Kyun Sohn, Singapore (SG); Chew-Hue Ang, Singapore (SG); Purakh Raj Vermo, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 101 days.

(21) Appl. No.: 11/039,428

(22) Filed: Jan. 20, 2005

(65) Prior Publication Data

US 2006/0160290 A1      Jul. 20, 2006

(51) Int. Cl.
    *H01L 21/322*    (2006.01)
(52) U.S. Cl. ............... 438/473; 438/592; 257/E21.634; 257/E21.635
(58) Field of Classification Search ................ 438/473; 257/E21.634, E21.636, E21.635
    See application file for complete search history.

(56) References Cited

U.S. PATENT DOCUMENTS

| | | | |
|---|---|---|---|
| 6,281,064 B1 * | 8/2001 | Mandelman et al. | 438/233 |
| 6,313,505 B2 * | 11/2001 | Yu | 257/336 |
| 6,331,458 B1 * | 12/2001 | Anjum et al. | 438/197 |
| 6,365,446 B1 * | 4/2002 | Chong et al. | 438/197 |
| 6,555,453 B1 | 4/2003 | Xiang | |
| 6,589,866 B1 | 7/2003 | Besser et al. | |
| 6,613,624 B2 * | 9/2003 | Wurzer | 438/200 |
| 6,756,255 B1 * | 6/2004 | Thuruthiyil et al. | 438/132 |
| 6,902,994 B2 * | 6/2005 | Gong et al. | 438/592 |
| 6,905,922 B2 * | 6/2005 | Lin et al. | 438/199 |
| 7,078,278 B2 * | 7/2006 | Pan et al. | 438/153 |
| 7,112,847 B1 * | 9/2006 | Yu et al. | 257/347 |
| 7,122,410 B2 * | 10/2006 | Kammler et al. | 438/154 |
| 2002/0008257 A1 | 1/2002 | Barnak et al. | |
| 2003/0020125 A1 * | 1/2003 | Mandelman et al. | 257/408 |
| 2004/0097041 A1 * | 5/2004 | Mandelman et al. | 438/270 |
| 2004/0106261 A1 | 6/2004 | Huotari et al. | |
| 2005/0070062 A1 * | 3/2005 | Visokay et al. | 438/236 |

(Continued)

OTHER PUBLICATIONS

J. H. Sim, H. C. Wen, J. P. Lu, and D. L Kwong, Dual Work Function Metal Gates Using Full Nickel Silicidation of Doped Poly-Si, IEEE Electron Device Letters ,vol. 24, No. 10, Oct. 2003 631-.

(Continued)

*Primary Examiner*—Kiesha L. Rose
*Assistant Examiner*—Igwe U Anya
(74) *Attorney, Agent, or Firm*—Horizon IP Pte Ltd

(57) ABSTRACT

An embodiment of fabrication of a variable work function gates in a FUSI device is described. The embodiment uses a work function doping implant to dope the polysilicon to achieve a desired work function. Selective epitaxy growth (SEG) is used to form silicon over the source/drain regions. The doped poly-Si gate is fully silicided to form fully silicided gates that have a desired work function. We provide a substrate having a NMOS region and a PMOS region. We form a gate dielectric layer and a gate layer over said substrate. We perform a (gate Vt) gate layer implant process to implant impurities such as P+, As+, B+, $BF_2$+, N+, Sb+, In+, C+, Si+, Ge+ or Ar+ into the gate layer gate in the NMOS gate regions and said PMOS gate regions. We form a cap layer over said gate layer. We pattern said cap layer, said gate layer and said gate dielectric layer to form a NMOS gate and a PMOS gate. Spacers are formed and S/D regions are formed. A metal is deposited over said substrate surface. We anneal said metal layer to form fully silicided NMOS gate and fully silicided PMOS gate.

33 Claims, 7 Drawing Sheets

U.S. PATENT DOCUMENTS

| | | | |
|---|---|---|---|
| 2005/0189599 A1* | 9/2005 | Lu | 257/412 |
| 2005/0258468 A1* | 11/2005 | Colombo et al. | 257/314 |
| 2005/0269635 A1* | 12/2005 | Bojarczuk et al. | 257/338 |
| 2005/0280104 A1* | 12/2005 | Li | 257/406 |
| 2006/0019437 A1* | 1/2006 | Murto et al. | 438/199 |
| 2006/0084247 A1* | 4/2006 | Liu | 438/510 |
| 2006/0105557 A1* | 5/2006 | Klee et al. | 438/592 |
| 2006/0118890 A1* | 6/2006 | Li | 257/410 |
| 2006/0131652 A1* | 6/2006 | Li | 257/350 |
| 2006/0134844 A1* | 6/2006 | Lu et al. | 438/199 |
| 2006/0134870 A1* | 6/2006 | Luan et al. | 438/287 |

OTHER PUBLICATIONS

Lahir S. Adam, Member, IEEE, Christopher Bowen, and Mark E. Law, Fellow, IEEE, On Implant-Based Multiple Gate Oxide Schemes for System-on-Chip Integration, IEEE Transactions on Electron Devices, vol. 50, No. 3, Mar. 2003 589-600, - (p. 592 is missing and not available).

* cited by examiner

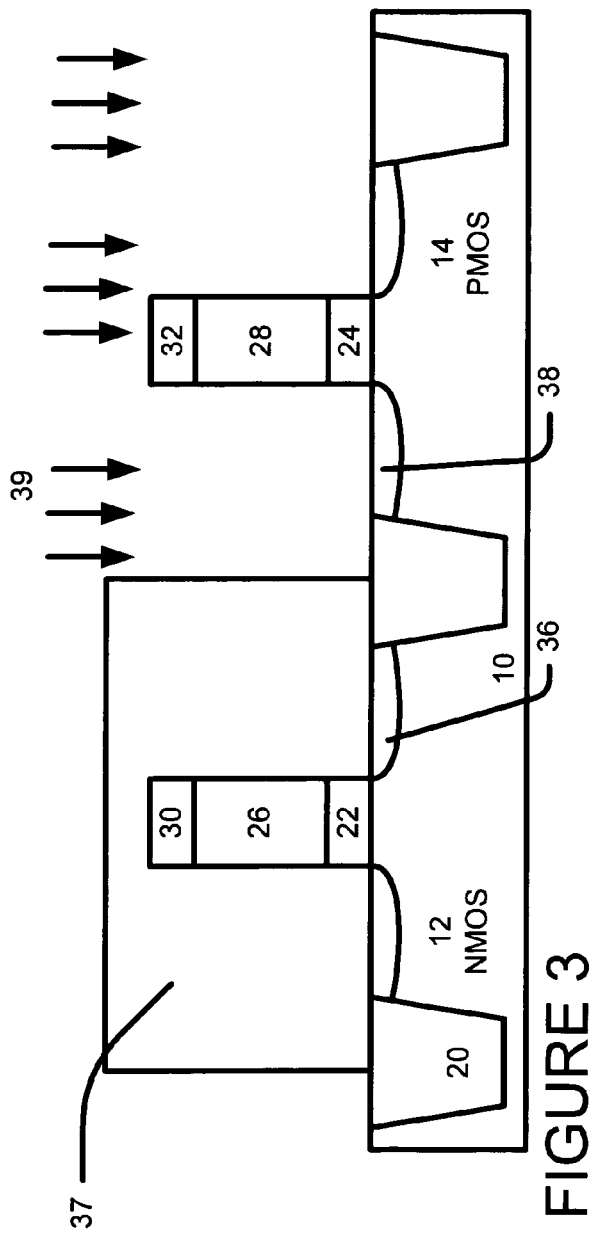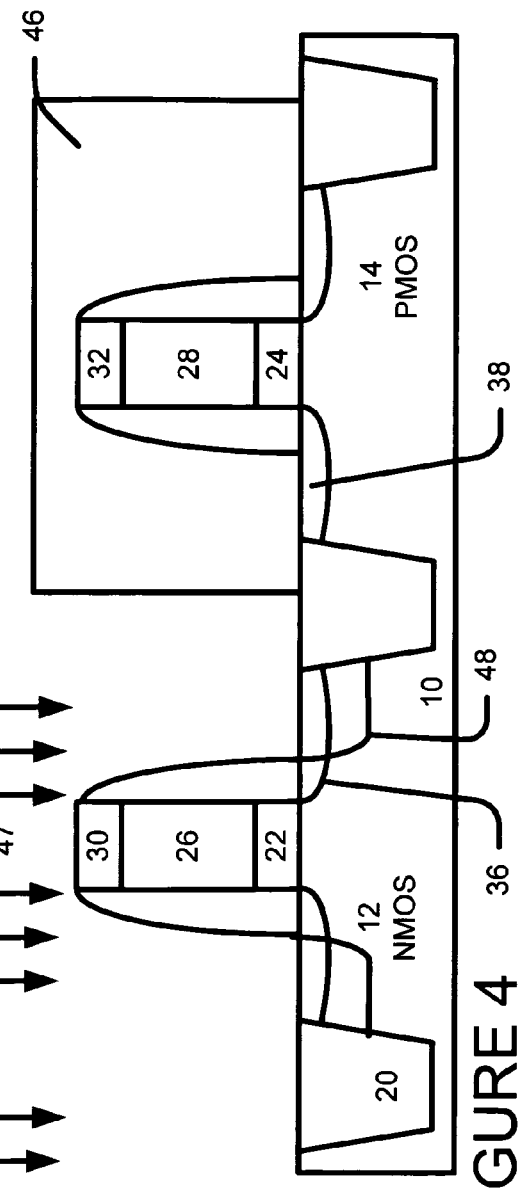

US 7,645,687 B2

METHOD TO FABRICATE VARIABLE WORK FUNCTION GATES FOR FUSI DEVICES

BACKGROUND OF INVENTION

1) Field of the Invention

This invention relates generally to the fabrication of semiconductor devices and particularly to the fabrication of variable work function gates for fully silicided (FUSI) devices.

2) Description of the Prior Art

In order to cater to different product applications, ultra large scale integrated (ULSI) circuits generally include a multitude of transistors with different threshold voltage, Vt values. This is true even for the same polarity devices, for e.g., for NMOSFETs, there is a need to fabricate high Vt, low Vt, and regular Vt devices on the same platform. Typically, the threshold voltages are tuned using Vt adjustment implants into the channel. However, excessive channel doping can degrade carrier mobility due to impurity scattering.

Relevant technical developments in the patent literature can be gleaned by considering the following.

J. H. Sim, H. C. Wen, J. P. Lu, and D. L. Kwong, Dual Work Function Metal Gates Using Full Nickel Silicidation of Doped Poly-Si, IEEE ELECTRON DEVICE LETTERS, VOL. 24, NO. 10, OCTOBER 2003 631-

Lahir S. Adam, Christopher Bowen, and Mark E. Law, On Implant-Based Multiple Gate Oxide Schemes for System-on-Chip Integration, IEEE TRANSACTIONS ON ELECTRON DEVICES, VOL. 50, NO. 3, MARCH 2003 589-600, U.S. Pat. No. 6,589,866 Besser, et al. Jul. 8, 2003—Metal gate with PVD amorphous silicon layer having implanted dopants for CMOS devices and method of making with a replacement gate process.

U.S. Pat. No. 6,555,453—Xiang, et al. Apr. 29, 2003—Fully nickel silicided metal gate with shallow junction formed.

US Patent Application 20040106261 A1 Huotari, et al.—Method of forming an electrode with adjusted work function.

US Patent Application 20020008257—RNAK, et al. Jan. 24, 2002

SUMMARY OF THE INVENTION

The example embodiments of the present invention provide a structure and a method of fabrication of a variable work function gates in a FUSI device.

An example embodiment for a method of fabrication of a variable work function gates in a FUSI device comprising the steps of:
a) providing a substrate having a NMOS region and a PMOS region;
b) forming a gate dielectric layer and a gate layer over the substrate;
c) performing a pre-dope polysilicon implant process by implanting impurities into the gate layer gate prior to gate patterning according to Vt requirements;
d) forming a cap layer over the gate layer;
e) patterning the cap layer, the gate layer and the gate dielectric layer to form a NMOS gate dielectric layer, a NMOS gate and NMOS cap in the NMOS region and a PMOS gate dielectric layer, a PMOS gate and PMOS cap in the PMOS region;
f) performing a NMOS SDE implant process to form NMOS SDE regions in the NMOS region;
g) performing a PMOS SDE implant to form PMOS SDE regions in the PMOS region;
h) forming NMOS spacers on the sidewalls of the NMOS gate and forming PMOS spacers on the sidewalls of the PMOS gate;
i) performing a NMOS S/D implant process to form NMOS S/D regions in the NMOS region;
j) performing a PMOS S/D implant to form PMOS S/D regions in the PMOS region;
k) annealing the substrate to activate the impurities in the substrate;
l) forming a NMOS silicon layer over the NMOS S/D region and a PMOS silicon layer over the PMOS S/D region using a selective epitaxial growth process;
m) removing the NMOS cap and the PMOS cap using a selective etch process;
n) depositing a metal over the substrate surface and the NMOS gate and the PMOS gate;
o) annealing the metal layer to form fully silicided NMOS gate and fully silicided PMOS gate and raised silicided NMOS S/D regions and raised silicided PMOS S/D regions; thereby the fully silicided NMOS gate and fully silicided PMOS gate have variable work functions.

Other example embodiments are shown in the detailed description and in the claims as filed and amended.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A, 1B, 1C, 1D, 2 through 8 are cross sectional views for illustrating a method of fabrication of a variable work function gates in a FUSI device according to an example embodiment of the present invention.

DETAILED DESCRIPTION OF THE EXAMPLE EMBODIMENTS

Embodiments of the present invention can eliminate the problem of poly-depletion and excessive channel doping for threshold voltage adjustment by forming CMOS devices using FUSI gates with variable work functions. This can be achieved by implanting suitable dopants at desired dose into the poly-Si gates prior to the FUSI process. This invention is not limited to only NiSi metal gates and is applicable to any metal-silicide system.

EXAMPLE EMBODIMENT

An example embodiment of the present invention will be described in detail with reference to the accompanying drawings. The present invention provides a method of fabrication of a variable work function gates in a FUSI device.

A. Provide a Substrate Having a NMOS Region and a PMOS Region

Figure 1A:
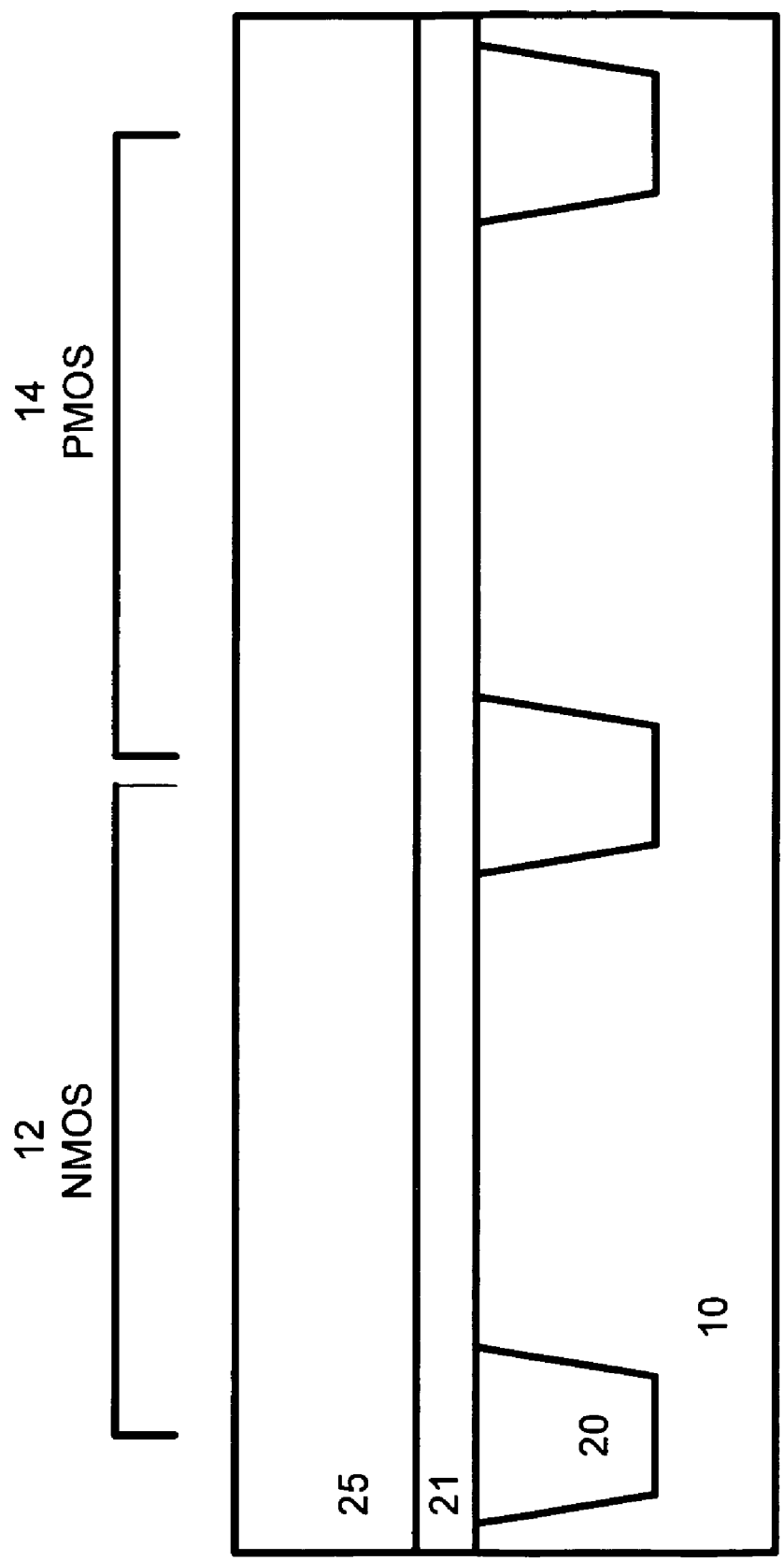

Referring to FIG. 1A, we provide a substrate 10 having a NMOS region 12 and a PMOS region 14. The NMOS region is where NMOS type device can be formed. The PMOS region is where PMOS type devices can be formed.

The substrate 10 preferably has isolation regions 20 that can separate the NMOS region 12 and the PMOS region 14.

The substrate 10 can be comprised of a crystalline silicon wafer, a silicon on insulator substrate (SOI), strained silicon or SiGe (silicon-germanium).

B. Forming a Gate Dielectric Layer and a Gate Layer

Next we form a gate dielectric layer 21 and a gate layer 25 preferably comprised of poly crystalline silicon (poly-Si) over the substrate. Gate layer 25 can also be made of poly crystalline silicon-germanium (poly-SiGe).

The gate layer 25 preferably has a thickness between 50 and 80 nm.

C. Perform a Pre-dope Gate (Polysilicon) (Gate Vt Adjustment) Implant Process into the NMOS Gate Region In this step, we perform a (polysilicon) gate layer pre-dope (gate Vt adjust) implant process in both the NMOS and PMOS gate regions to implant impurities such as P+, As+, B+, BF$_2$+, N+, Sb+, In+, C+, Si+, Ge+ or Ar+ into the gate layer 25 prior to gate patterning, according to Vt requirements.

Figure 1B:
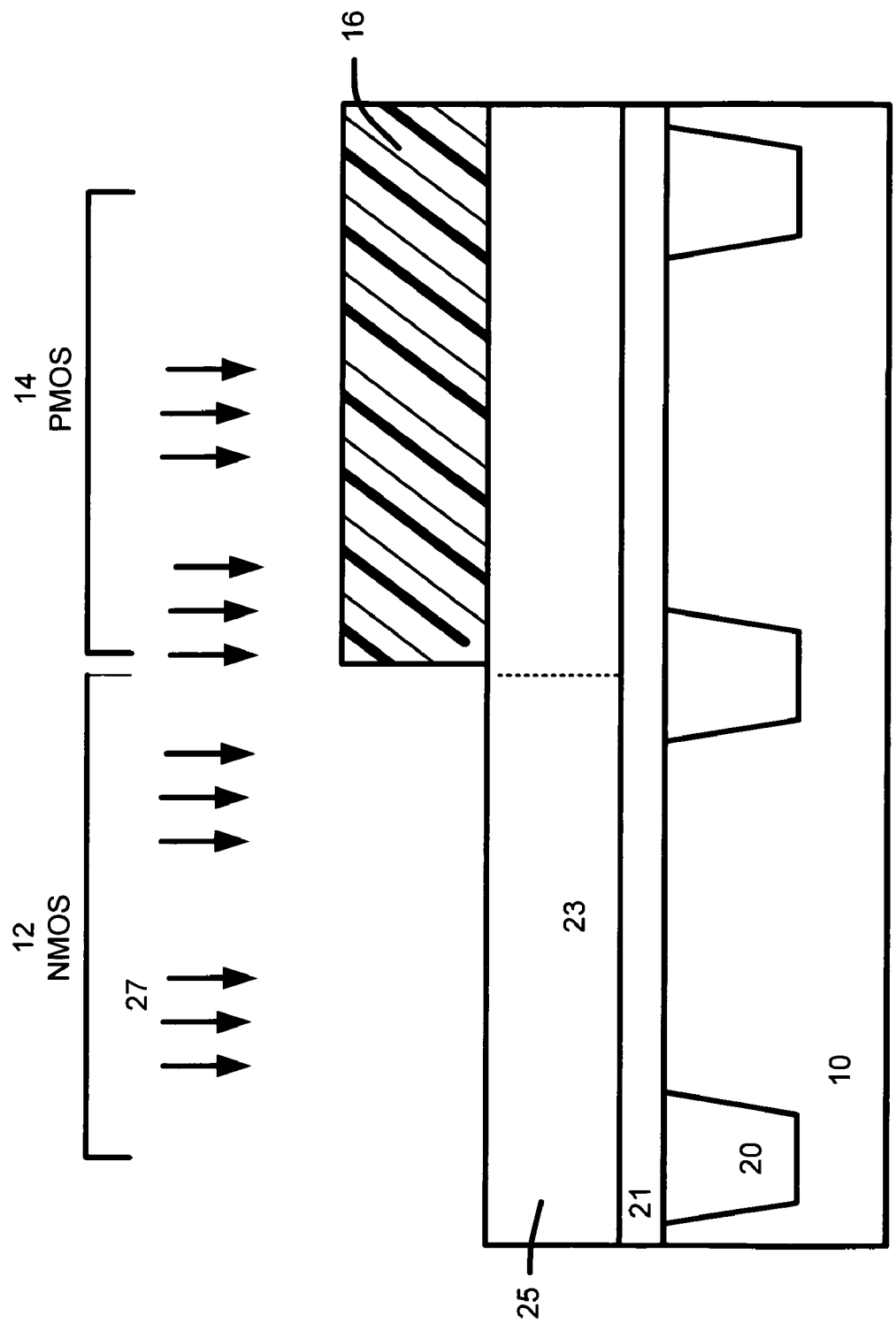

Referring to FIG. 1B, we perform a NMOS gate pre-dope gate layer implant process 27 into gate layer 25 to form NMOS gate region 23 in the NMOS region 12.

The NMOS gate pre-dope implant process 27 preferably comprises forming a NMOS gate pre-dope mask 16 over the PMOS region 14 and implanting gate dopant ions 27 into the gate layer 25 in the NMOS region 12. We remove the NMOS gate pre-dope mask 16.

Figure 1C:
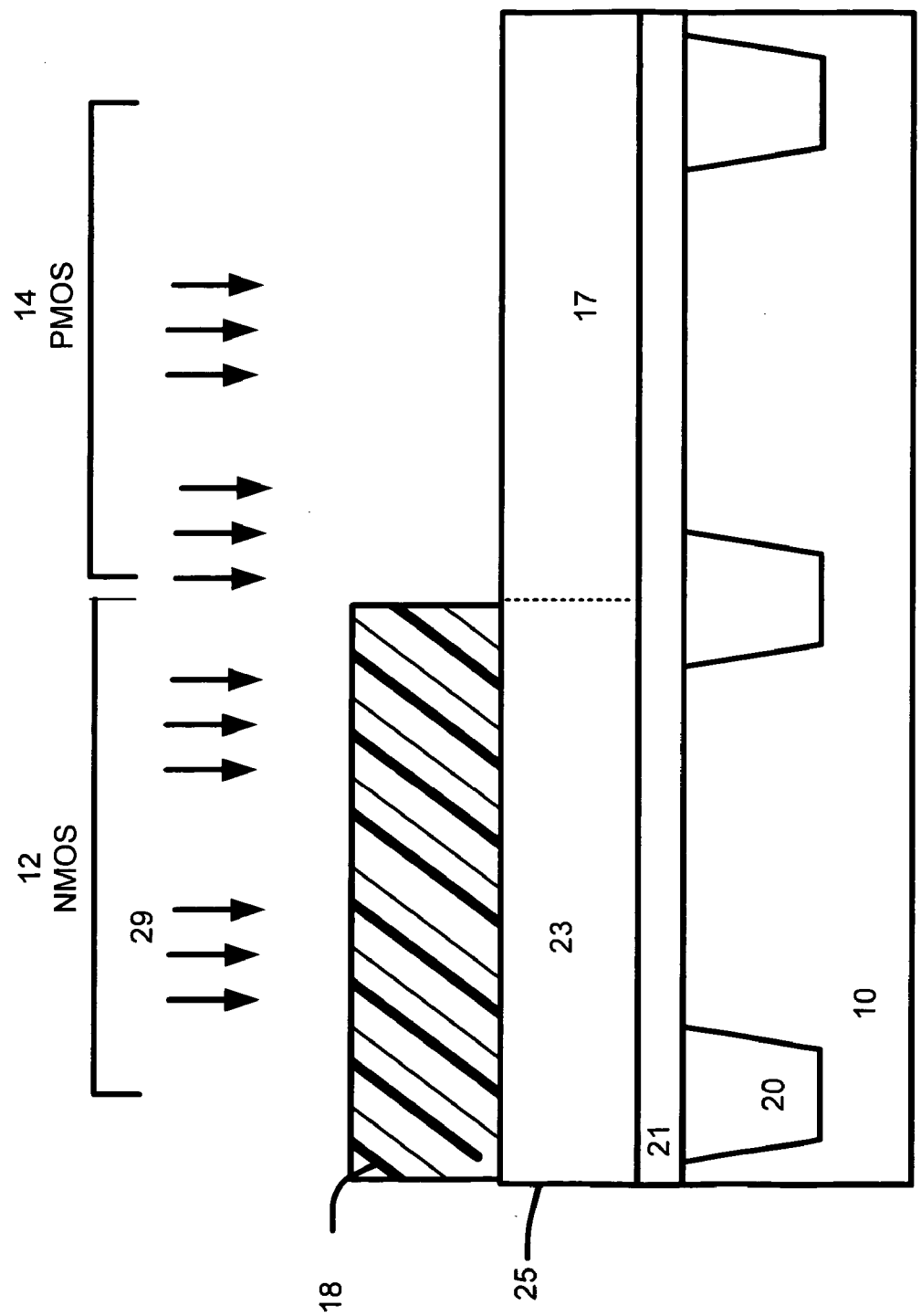

D. Performing a Pre-dope Gate Layer (Gate Vt Adjustment) Implant Process into the PMOS Gate Region Referring to FIG. 1C, we perform a PMOS gate pre-dope gate layer implant process 29 into gate layer 25 to form PMOS gate region 17 in the PMOS region 14.

The PMOS gate pre-dope gate layer implant process 29 preferably comprises forming a PMOS gate pre-dope mask 18 over the NMOS region 12 and implanting gate dopant ions 29 into the gate layer 25 in the PMOS region 14.

We remove the PMOS gate pre-dope mask 18.

For the gate dopant ion implantation process, the implantation dose for the impurities is in the range of $5 \times 10^{14}/cm^2$ and $1 \times 10^{16}/cm^2$, with implantation energies of between 3 keV and 100 keV. The resulting impurity concentration in the gate layer is in the range of 1E18 atoms/cm$^3$ and 3E20 atoms/cm$^3$.

We can include co-dopants to modulate the Vt such as P+, As+, B+, BF$_2$+, N+, Sb+, In+, C+, Si+, Ge+ or Ar+. Co-dopants refer to any combination of the impurity species listed above that is to be implanted into the gate layer 25. The advantage is that sometimes there may not exist a single type of dopant that can modify the gate work function to meet the Vt requirements. Hence, by the implantation of different dopants into the gate, we can tailor the work function more easily since different dopants can have different effects on the work function. Another advantage is that we can make use of the different ions for stress engineering in the gate. Different amount of stress in the gate can result in different Vt of the devices.

This ion implantation process is the main doping of the poly-Si for Vt setting. Preferably the source/drain extension (SDE) ion implantation does not dope the poly-Si because there will be a nitride cap layer over the poly-Si.

E. Form a Cap Layer Over the Gate Layer

Next, we form a cap layer over the gate layer 25. The cap layer is preferably comprised of SiN and has a thickness between 300 and 800 angstroms.

F. Patterning the Cap Layer, the Gate Layer and the Gate Dielectric Layer

Figure 1D:
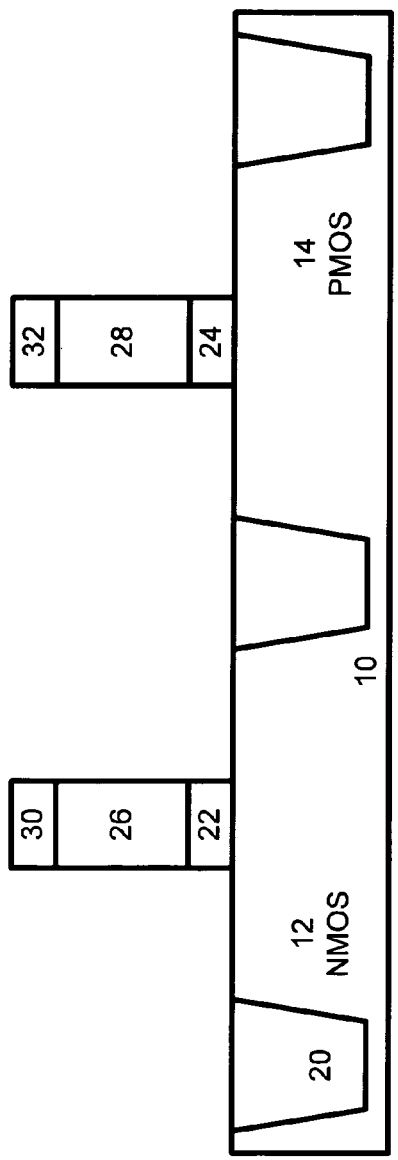

As shown in FIG. 1D, we pattern the cap layer, the gate layer 25 and the gate dielectric layer 21 to form a NMOS gate dielectric layer 22, a NMOS gate 26 and NMOS cap 30 in the NMOS region 12 and a PMOS gate dielectric layer 24, a PMOS gate 28 and PMOS cap 32 in the PMOS region 14.

G. Perform a NMOS SDE Implant Process

Figure 2:
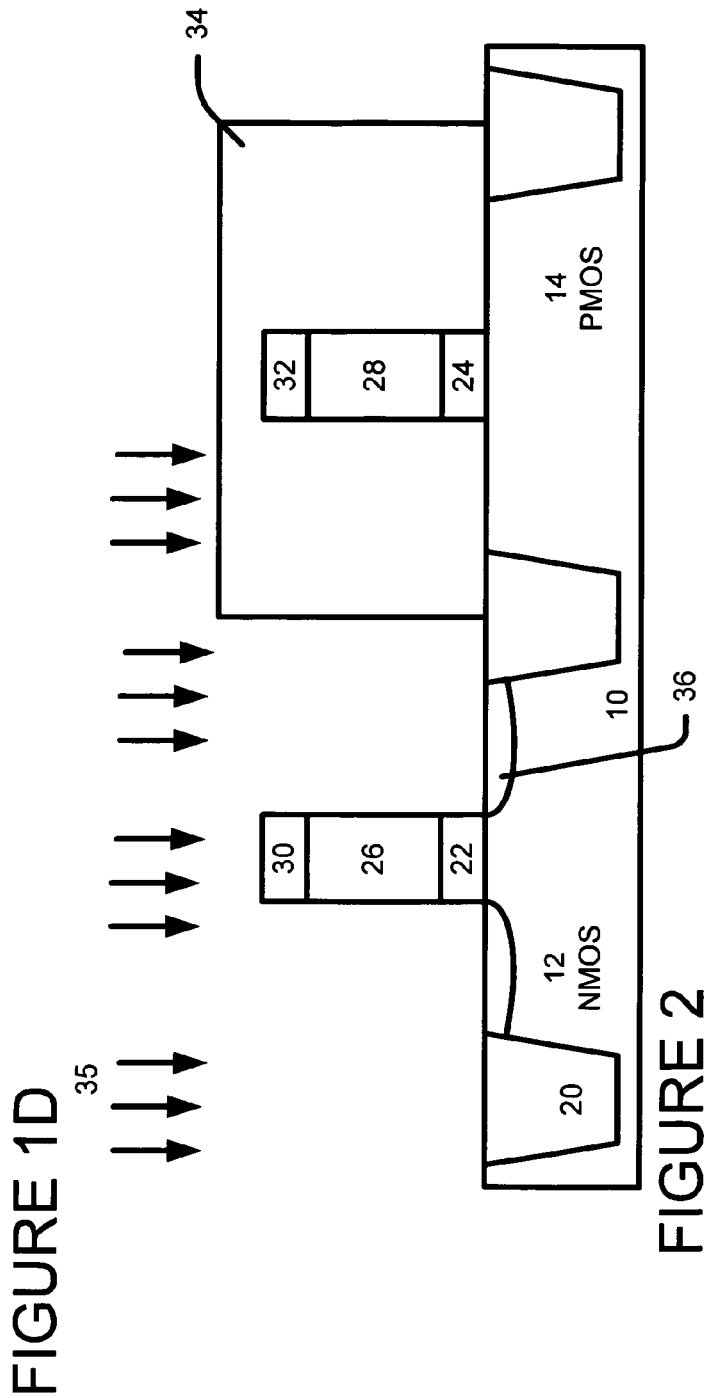

Referring to FIG. 2, we perform a NMOS source/drain extension (SDE) implant process 35 to form NMOS SDE regions 36 in the NMOS region 12.

The NMOS SDE implant process 35 preferably comprises forming a NMOS SDE mask 34 over the PMOS region 14 and implanting N type impurity ions 35 into the substrate 10 in the NMOS region 12 and the NMOS cap 30.

We remove the NMOS SDE mask 34.

Preferably the NMOS SDE ion implantation does not dope the poly gate layer.

The NMOS SDE implant is performed with P or As ions at a dose between $5 \times 10^{14}/cm^2$ and $3 \times 10^{15}/cm^2$ and an energy between 0.5 keV and 15 keV.

H. Perform a PMOS SDE Implant

Referring to FIG. 3, we perform a PMOS SDE implant 39 to form PMOS SDE regions 38 in the PMOS region 14.

The PMOS SDE implant process 39 comprises forming a PMOS SDE mask 37 over the NMOS region 12 and implanting P type impurity ions 39 into the substrate 10 in the PMOS region 14 and the PMOS cap 32.

The PMOS SDE implant is performed with B or BF$_2$ ions at a dose between $5 \times 10^{14}/cm^2$ and $3 \times 10^{15}/cm^2$ and an energy between 0.2 keV and 10 keV.

We remove the PMOS SDE mask 37.

I. Form NMOS Spacers and PMOS Spacers

Referring to FIG. 4, we form NMOS spacers 42 on the sidewalls of the NMOS gate 26 and forming PMOS spacers 44 on the sidewalls of the PMOS gate 28.

The NMOS spacers 42 and the PMOS spacers 44 preferably comprised of silicon oxide or silicon oxynitride or nitride and preferably of oxide with a thickness between 300 and 800 Å.

J. Perform a NMOS S/D Implant Process

We preferably perform a NMOS S/D implant process 47 to form NMOS S/D regions 48 in the NMOS region 12.

The NMOS S/D implant process comprises forming a NMOS S/D mask 46 over the PMOS region 14 and implanting N type impurity ions 47 into the substrate 10 in the NMOS region 12 and the NMOS gate 26.

The NMOS S/D implant is performed with P or As ions at a dose between $1 \times 10^{15}/cm^2$ and $1 \times 10^{16}/cm^2$ and an energy between 2 keV and 30 keV.

We remove the NMOS S/D mask 46.

K. Performing a PMOS S/D Implant

Figure 5:
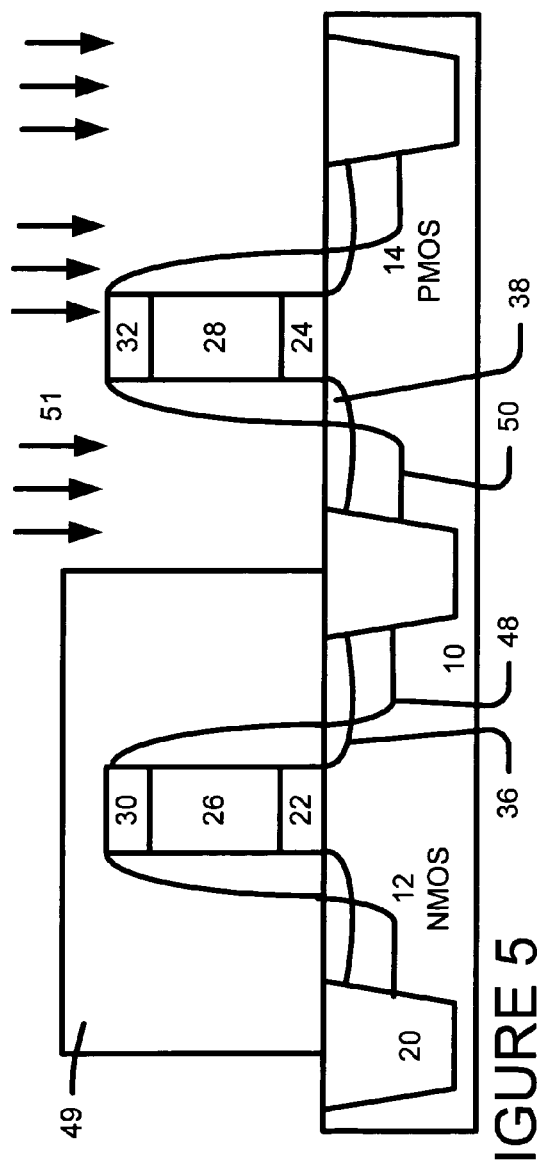

Referring to FIG. 5, we perform a PMOS S/D implant 51 to form PMOS S/D regions 50 in the PMOS region 14.

The PMOS S/D implant process 51 preferably comprises forming a PMOS S/D mask 49 over the NMOS region 12 and implanting P type impurity ions 51 into the substrate 10 in the PMOS region 14 and the PMOS gate 28; and removing the PMOS S/D mask 49.

B+ or BF2+ is implanted into the PMOS gate, As+ or P+ is implanted into the NMOS gate.

The PMOS S/D I/I could dope the poly gate layer. Depending on the thickness of the nitride cap over the poly and the energy of the S/D I/I, the PMOS S/D I/I may dope the poly gate layer. However, the doping of the gate by the S/D I/I is preferably not the main doping for Vt modulation.

The PMOS S/D implant is performed with B or $BF_2$ ions at a dose between $1 \times 10^{15}/cm^2$ and $1 \times 10^{16}/cm^2$ and an energy between 2 keV and 20 keV.

The S/D I/I could be used in co-doping process to dope the gate and affect the work function and get the desired work function or Vt.

L. Annealing the Substrate to Activate the Impurities in the Substrate and in NMOS and PMOS Gates Next, we anneal the substrate to activate the impurities in the substrate such as the S/D regions, and the NMOS and PMOS gates. Preferably we use an RTA process with a temperature between 1000 and 1300 C for a time between 500 microsec and 5 sec.

Figure 6:
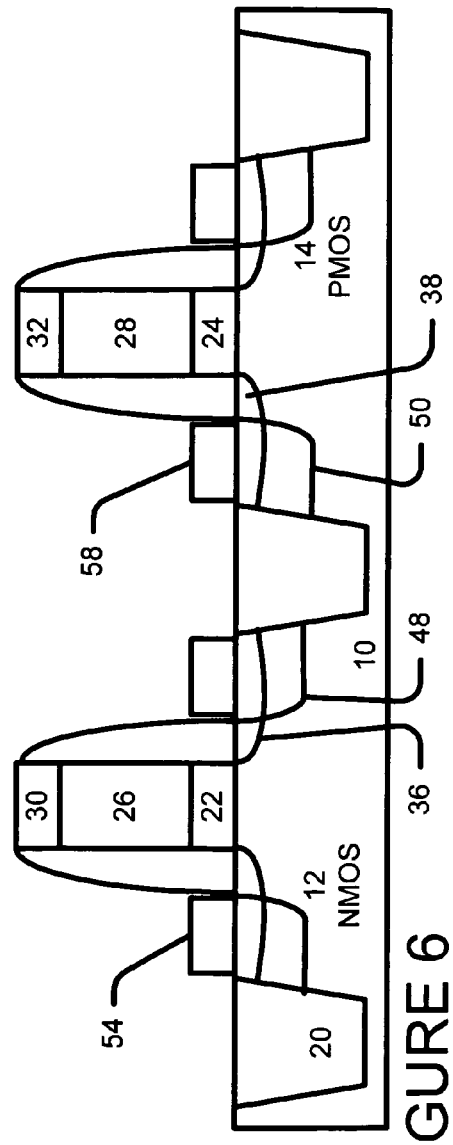

M. Form a NMOS Silicon Layer and a PMOS Silicon Layer Using a Selective Epitaxial Growth (SEG) Process Referring to FIG. 6, we form a NMOS silicon layer 54 over the NMOS S/D region 48 and a PMOS silicon layer 58 over the PMOS S/D region 50 using a selective epitaxial growth (SEG) process.

The NMOS silicon layer 54 and a PMOS silicon layer 58 preferably have a thickness between 30 and 60 nm.

We remove the NMOS cap 30 and the PMOS cap 32 using a selective etch process.

The silicon layers 54 and 58 are formed to a thickness to prevent excessive amounts of the source and drain (S/D) regions from being consumed by the subsequent silicide processes to form the completely fully silicide gates. Hence, the silicidation of the gate (FUSI) and the S/D regions can be done simultaneously. This is different to the conventional way of forming FUSI gates where the gates and the S/D regions are formed separately. Usually, the thin silicide at the S/D regions is formed first, followed by the deposition of more metal to react with the gate to form a thicker silicide at the gates (full silicidation).

N. Depositing a Metal

Figure 7:
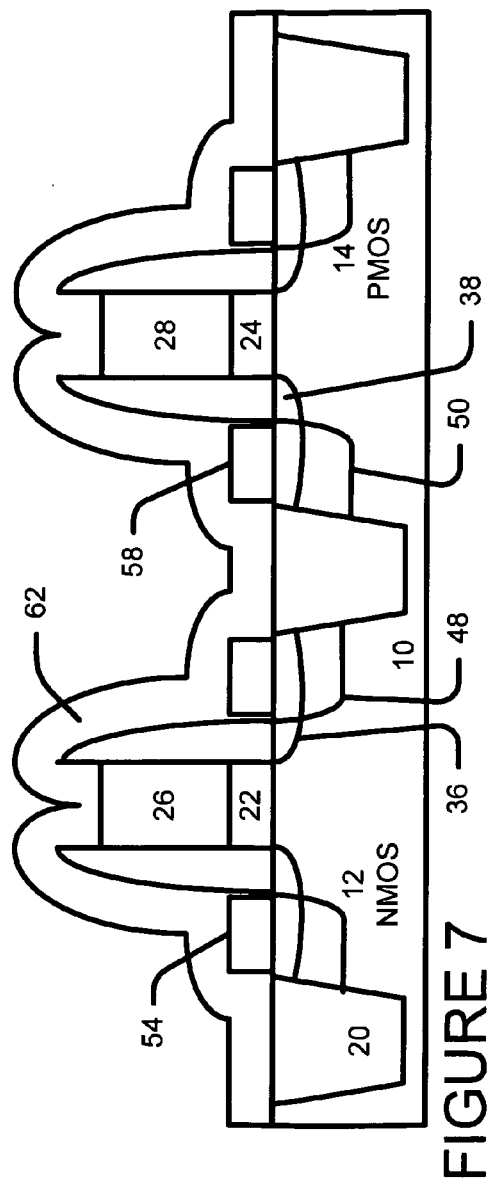

As shown in FIG. 7, we deposit a metal 62 (e.g., essentially Ni, Pt, NiPt, NiPd or Co, or combinations thereof) over the substrate surface and the NMOS gate 26 and the PMOS gate 28.

We deposit a metal, such as essentially Ni, Pt, NiPt, NiPd or Co and most preferably Ni. The advantages of using an alloy of Ni such as NiPt or NiPd as an alternative metal are that the silicides formed from these alloys with silicon have higher thermal stability than pure nickel silicides. Hence, there is less agglomeration and less undesired growth/formation of NiSi on regions where there should not have any silicide.

The theoretical ratio of the amount of Ni needed to form NiSi is Ni:Si:NiSi=1:1.84:2.22 with ~10% range limits. For e.g., for the FUSI of a 70 nm poly-Si gate 26 and 28, threshold thickness of Ni 62 to provide sufficient amount of Ni to ensure fully silicidation is 38 nm.

Figure 8:
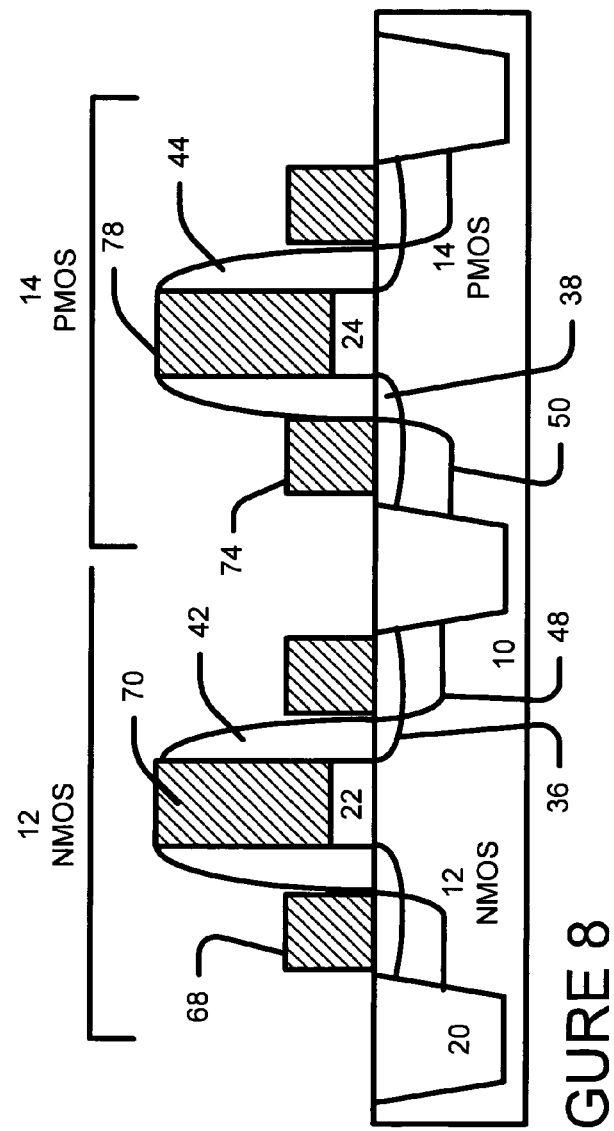

O. Annealing the Metal Layer to Form Fully Silicided NMOS Gate and Fully Silicided PMOS Gate and Raised Silicided NMOS S/D Regions and Raised Silicided PMOS S/D Regions As shown in FIG. 8, we anneal the metal layer to form fully silicided NMOS gate 70 and fully silicided PMOS gate 78 and raised silicided NMOS S/D regions 68 and raised silicided PMOS S/D regions 74.

Fully silicided means that essentially all of the poly gates 26 and 28 are reacted to form silicide 70 and 78.

Preferably, between 0 and 500 Angstroms of the substrate below the NMOS silicon layer 54 and PMOS silicon layer 58 are consumed.

Layers 68 and 74 preferably have a thickness of between about 55 and 100 nm.

The fully silicided NMOS gate 70 and fully silicided PMOS gate 78 preferably have a thickness between 55 and 100 nm.

If there is any unreacted metal left, we can remove the unreacted metal (e.g., Ni) with an optional selective metal etch process. It is preferably a wet etch.

Thus, FUSI gates with variable work functions are formed. This in turn forms transistors with different threshold voltages.

P. Non-limiting Features of the Example Embodiment

The embodiment's FUSI gates have many advantages. The advantages of FUSI include: tunable gate work functions with suitable doping, elimination of the poly-Si depletion effect while compatible with conventional semiconductor materials and processes; for e.g. no new etch process is required for gate pattern definition since the poly-Si is first etched to form gate electrodes followed by full silicidation. This is different from the conventional metal gates where the metals are first deposited and etched to form gate electrodes. Also, for conventional metal gates, there is a concern of metallic contamination into the gate dielectric.

The embodiments are intended module the gate work function in the broadest sense. Hence the embodiments can be applied to make 2, 3 or more different work function FUSI gates and it is not limited to "dual work function metal gates". Present day devices can have multiple gates with different work functions (and Vt) requirements, the embodiments can be used to make 2 or more gates with different work functions (and Vt). Even for the same polarity devices, for e.g., NMOS-FETs there is a need to fabricate high Vt, low Vt, and regular Vt NMOS devices.

The embodiments of the invention can have any combination of the following features:

1. use of selective epitaxial growth (SEG) of Si over the source/drain (S/D) regions to form raised S/D structures.

2. The embodiments form NiSi and other metal/silicide fully silicided (FUSI) gates. The advantages of FUSI include: tunable gate work functions with suitable doping, elimination of the poly-Si depletion effect while compatible with conventional semiconductor materials and processes; for e.g. no new etch process is required for gate pattern definition since the poly-Si is first etched to form gate electrodes followed by full silicidation. This is different from the conventional metal gates where the metals are first deposited and etched to form gate electrodes. Also, for conventional metal gates, there is a concern of metallic contamination into the gate dielectric.

3. We can include co-dopants to modulate the Vt such as P+, As+, B+, $BF_2$+, N+, Sb+, In+, C+, Si+, Ge+ or Ar+.

4. Gate electrodes with three or more work functions can be formed on the same chip.

5. The Source/Drain implants can be used to dope the PMOS and/or NMOS gates (co-doping) to achieve the desired work function.

Q. Non-limiting Example Embodiments

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of variable work function gates in a FUSI device comprising the steps of:
   providing a substrate having a NMOS region and a PMOS region;
   forming a gate dielectric layer over the substrate;
   forming a gate electrode layer over the gate dielectric layer;
   performing a pre-dope gate layer implant process to implant impurities into the gate electrode layer;
   forming a cap layer over the gate electrode layer after the pre-dope gate layer implant process;
   patterning the cap layer, the gate electrode layer and the gate dielectric layer to form a NMOS gate structure in the NMOS region and a PMOS gate structure in the PMOS region;
   forming NMOS source/drain (S/D) regions in the NMOS region adjacent to the NMOS gate structure and forming PMOS S/D regions in the PMOS region adjacent to the PMOS gate structure, wherein a thickness of the cap layer is selected to enable doping of the gate electrode layer of the NMOS and PMOS gate structure through the cap layer according to workfunction requirements during formation of the S/D regions;
   forming silicon layers over the NMOS and PMOS S/D regions;
   depositing a metal over the substrate and the NMOS gate and the PMOS gate; and
   annealing the substrate to form fully silicided NMOS gate with raised silicided NMOS S/D regions and a fully silicided PMOS gate with raised silicided PMOS S/D regions.

2. The method of claim 1 wherein the pre-dope gate layer implant process comprises:
   masking the gate layer in the PMOS region and implanting pre-gate dopants into the gate electrode layer in the NMOS region to form a NMOS gate region; and
   masking the gate layer in the NMOS region and implanting pre-gate dopants into the gate electrode layer in the PMOS region to form a PMOS gate region.

3. The method of claim 1 which further includes:
   forming NMOS spacers on sidewalls of the NMOS gate and forming PMOS spacers on the sidewalls of the PMOS gate;
   performing a NMOS S/D implant process to form NMOS S/D regions in the NMOS region;
   performing a PMOS S/D implant to form PMOS S/D regions in the PMOS region; and
   removing the NMOS cap and the PMOS cap using a selective etch process.

4. A method for forming an integrated circuit with variable work function transistors comprising:
   providing a substrate having first and second active regions on which first and second transistors are formed, the active regions are isolated by an isolation region;
   forming gate stack layers, wherein forming gate stack layers includes forming a gate dielectric layer over the substrate, a gate electrode layer over the gate dielectric layer and a cap layer over the gate electrode layer;
   implanting dopants into the gate electrode layer prior to forming the cap layer;
   patterning the gate stack layers to form first and second gate stacks in the first and second active regions, the gate stacks comprise a gate dielectric, gate electrode and gate cap;
   forming first S/D regions adjacent to the first gate stack and second S/D regions adjacent to the second gate stack, wherein during forming the S/D regions, a thickness of the cap layer is selected to enable doping of the gate electrode layer through the cap layer according to workfunction requirements;

forming silicon layers over the first and second S/D regions;

removing the gate cap on the gate stacks;

depositing a metal layer over the substrate covering the first and second S/D regions and first and second gate stacks; and annealing the substrate to form fully silicided gate electrodes and raised silicided S/D regions.

5. The method of claim 4 wherein the first transistor comprises a p-type transistor and the second transistor comprises a n-type transistor.

6. The method of claim 5 wherein implanting dopants into the gate electrode layer comprises:

masking the gate electrode layer in the second region and implanting first dopants into the gate electrode layer in the first region; and masking the gate electrode layer in the first region and implanting second dopants into the gate layer in the second region.

7. The method of claim 5 wherein forming S/D regions of the first and second gate stacks comprises:

implanting first-type dopants to form first SDE regions of first gate stack;

implanting second-type dopants to form second SDE regions of second gate stack;

forming spacers on sidewalls of the first and second gate stacks;

implanting first-type dopants to form first S/D regions of the first gate stack; and implanting second-type dopants to form second S/D regions of the second gate stack.

8. The method of claim 5 comprises annealing the substrate to activate the dopants in the S/D regions and gate electrode layer.

9. The method of claim 4 comprises annealing the substrate to activate the dopants in the S/D regions and gate electrode layer.

10. The method of claim 9 wherein implanting dopants into the gate electrode layer comprises:

masking the gate electrode layer in the second region and implanting first dopants into the gate electrode layer in the first region; and masking the gate electrode layer in the first region and implanting second dopants into the gate layer in the second region.

11. The method of claim 10 wherein forming S/D regions of the first and second gate stacks comprises:

implanting first-type dopants to form first SDE regions of first gate stack;

implanting second-type dopants to form second SDE regions of second gate stack;

forming spacers on sidewalls of the first and second gate stacks;

implanting first-type dopants to form first S/D regions of the first gate stack; and implanting second-type dopants to form second S/D regions of the second gate stack.

12. The method of claim 4 wherein implanting dopants into the gate electrode layer comprises:

masking the gate electrode layer in the second region and implanting first dopants into the gate electrode layer in the first region; and masking the gate electrode layer in the first region and implanting second dopants into the gate layer in the second region.

13. The method of claim 4 wherein forming S/D regions of the first and second gate stacks comprises:

implanting first-type dopants to form first SDE regions of first gate stack;

implanting second-type dopants to form second SDE regions of second gate stack;

forming spacers on sidewalls of the first and second gate stacks;

implanting first-type dopants to form first S/D regions of the first gate stack; and implanting second-type dopants to form second S/D regions of the second gate stack.

14. The method of claim 4 further comprises forming spacers on sidewalls of the first and second gate stacks prior to forming S/D regions.

15. The method of claim 4 wherein forming silicon layers on S/D regions comprises selective epitaxial growth.

16. The method of claim 4 wherein depositing the metal layer comprises depositing metal selected from the group consisting of Ni, Pt, NiPt, NiPd, Co or a combination thereof.

17. The method of claim 16 wherein implanting dopants into the gate electrode layer comprises implanting dopants selected from the group consisting of P+, As+, B+, $BF_2$+, N+, Sb+, In+, C+, Si+, Ge+, Ar+, or combinations thereof.

18. The method of claim 4 wherein implanting dopants into the gate electrode layer comprises implanting dopants selected from the group consisting of P+, As+, B+, $BF_2$+, N+, Sb+, In+, C+, Si+, Ge+, Ar+, or combinations thereof.

19. The method of claim 4 wherein implanting dopants into the gate electrode layer comprises implanting two or more species of dopants.

20. A method for forming an integrated circuit with a variable work function transistor comprising:

providing a substrate having an active region on which a transistor is formed;

forming gate stack layers, wherein forming gate stack layers includes forming a gate dielectric layer over the substrate, forming a gate electrode layer over the gate dielectric layer, and implanting dopants into the gate electrode layer prior to forming a cap layer over the gate electrode layer;

patterning the gate stack layers to form a gate stack;

forming S/D regions adjacent to the gate stack; and annealing the substrate to activate the dopants in the S/D regions and gate electrode layer, wherein during forming the S/D regions, a thickness of the cap layer is selected to enable doping of the gate electrode layer through the cap layer according to workfunction requirements.

21. The method of claim 20 wherein forming S/D regions comprises:

implanting dopants to form SDE regions of the gate stack;

forming spacers on sidewalls of the gate stack; and implanting dopants to form first S/D regions of the gate stack.

22. The method of claim 21 further comprises forming spacers on sidewalls of gate stack prior to forming S/D regions.

23. The method of claim 21 comprises forming silicon layers on S/D regions that comprises selective epitaxial growth.

24. The method of claim 20 wherein forming S/D regions comprises:
  implanting dopants to form SDE regions of the gate stack;
  forming spacers on sidewalls of the gate stack; and
  implanting dopants to form first S/D regions of the gate stack.

25. The method of claim 20 further comprises forming spacers on sidewalls of gate stack prior to forming S/D regions.

26. The method of claim 20 wherein implanting dopants into the gate electrode layer comprises implanting dopants selected from the group consisting of P+, As+, B+, $BF_2$, N+, Sb+, In+, C+, Si+, Ge+, Ar+, or combinations thereof.

27. The method of claim 20 comprises implanting dopants into the gate electrode layer prior to forming the cap layer.

28. The method of claim 20 comprises:
  forming silicon layers over the S/D regions;
  removing the cap layer on the gate stack;
  depositing a metal layer over the substrate covering the S/D regions and the gate stack; and
  annealing the substrate to form a fully silicided gate electrode and raised silicided S/D regions.

29. The method of claim 28 comprises implanting dopants into the gate electrode layer prior to forming the cap layer.

30. The method of claim 20 comprises:
  providing a second active region on the substrate;
  wherein patterning the gate stack layers forms a second gate stack in the second active region;
  forming second S/D regions adjacent to the second gate stack in the second active region, wherein during forming the second S/D regions, the thickness of the cap layer is selected to enable doping of the gate electrode layer of the second gate stack according to workfunction requirements.

31. The method of claim 30 comprises implanting dopants into the gate electrode layer prior to forming the cap layer.

32. The method of claim 30 comprises:
  forming silicon layers over the S/D regions;
  removing the cap layer on the gate stacks;
  depositing a metal layer over the substrate covering the S/D regions and the gate stacks; and
  annealing the substrate to form a fully silicided gate electrodes and raised silicided S/D regions.

33. The method of claim 32 comprises implanting dopants into the gate electrode layer prior to forming the cap layer.

* * * * *